United States Patent
Chan

(10) Patent No.: US 7,676,709 B2
(45) Date of Patent: Mar. 9, 2010

(54) SELF-TEST OUTPUT FOR HIGH-DENSITY BIST

(75) Inventor: Adrian Chan, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 48 days.

(21) Appl. No.: 11/690,151

(22) Filed: Mar. 23, 2007

(65) Prior Publication Data

US 2008/0235547 A1 Sep. 25, 2008

(51) Int. Cl.
*G11C 29/00* (2006.01)
*G01R 31/28* (2006.01)
(52) U.S. Cl. .................................. 714/719; 714/733
(58) Field of Classification Search ......... 714/718–723; 365/200–201
See application file for complete search history.

(56) References Cited

U.S. PATENT DOCUMENTS

| | | | | |
|---|---|---|---|---|
| 5,568,437 | A * | 10/1996 | Jamal | 365/201 |
| 6,061,282 | A * | 5/2000 | Tamaki | 365/201 |
| 6,108,252 | A * | 8/2000 | Park | 365/201 |
| 6,343,366 | B1 * | 1/2002 | Okitaka | 714/733 |
| 6,359,818 | B2 * | 3/2002 | Suzuki | 365/201 |
| 6,658,611 | B1 * | 12/2003 | Jun | 714/719 |
| 7,053,470 | B1 * | 5/2006 | Sellers et al. | 257/678 |
| 7,062,689 | B2 * | 6/2006 | Slobodnik | 714/718 |
| 7,313,739 | B2 * | 12/2007 | Menon et al. | 714/718 |

FOREIGN PATENT DOCUMENTS

| | | | |
|---|---|---|---|
| KR | 2003002435 A | * | 1/2003 |
| TW | 477898 A | * | 3/2008 |

OTHER PUBLICATIONS

"The testing of multiple RAM Cores in Soc system" by Wang et al. This paper appears in: Solid-State and Integrated Circuit Technology, 2006. ICSICT '06. 8th International Conference on Publication Date: 2006 On pp. 2148-2150 ISBN: 1-4244-0160-7 INSPEC Accession No. 9408795.*

\* cited by examiner

*Primary Examiner*—Cynthia Britt
(74) *Attorney, Agent, or Firm*—Dawn V. Stephens; Wade James Brady, III; Frederick J. Telecky, Jr.

(57) ABSTRACT

A method, apparatus and system of a self-test output for high density BIST are disclosed. In one embodiment, an integrated circuit includes one or more memories, a BIST controller coupled to the one or more memories to perform write operation and to receive a PASS/FAIL signal from each embedded memory and one or more comparators coupled to the one or more memories latch mutually identical outputted data coming from the memories upon a rising edge of an ORDY signal. In addition, the comparators may compare the latched mutually identical outputted data and output associated PASS/FAIL signal to the BIST controller. The BIST controller registers the received PASS/FAIL result upon receiving the PASS/FAIL signal from the comparators. The integrated circuit may include output registers coupled to the BIST controller and the comparators output a data log substantially serially upon receiving a SHIFT/CLK signal from the BIST controller.

10 Claims, 7 Drawing Sheets

| DI_x | DI_y | XOR | DO_x_y |
|---|---|---|---|
| 0 | 0 | 0 | PASS |
| 0 | 1 | 1 | FAIL |
| 1 | 0 | 1 | FAIL |
| 1 | 1 | 0 | PASS |

SELF-TEST OUTPUT FOR HIGH-DENSITY BIST

FIELD OF TECHNOLOGY

This disclosure relates generally to the technical fields of software and/or hardware technology and, in one example embodiment, to a method, apparatus and system of a self-test output for high density BIST (Built-In Self Test).

BACKGROUND

Most VLSI (very large scale integrated) circuits may have embedded memory arrays. Total size of these memories may range within certain limits (e.g., from 3 to 80 megabits) and/or may have defined range of instances (e.g., over 600 instances) of such memories of an ASIC (application specific integrated circuit) device. Design effort and/or silicon overhead for a design for test (DFT) of VLSI circuits have become a significant part of semiconductor chip design. Unlike memory ICs, embedded memory ports may not have a privilege of direct access through integrated circuit (IC) pins. This may result in use of BIST (Built-In -Self Test) as a widely accepted on-chip memory test solution. There may b e many variants of BIST based on capability and/or features.

In all cases, outputs may be tested against expected outputs and may place a requirement for the BIST to produce and/or synchronize expected versus actual memory test outputs. For wide-word width memories, outputs may need to be sliced into smaller segments to fit within the BIST comparator's data bandwidth. In order to complete the test, repeated read cycles may be necessary to cover all the outputs. Multiplexers may be needed to select an appropriate output segment of the memory for a compare function.

Timing closure may be a big challenge for ICs with large members of embedded memory arrays, along with reduction of silicon area for BIST. Other problems in conventional use of BIST in complex VLSI circuits may include complex read architecture, backward data path to the controller for feeding the outputs for compare and/or large product design cycle times due to a need for extensive timing verification.

SUMMARY

A method, apparatus and system of a self-text output for high density BIST are disclosed. In one aspect, an integrated circuit (IC) includes one or more memories (e.g. the one or more memories may include memories selected from the group consisting of embedded memories, embedded SRAMs, DRAMs, FRAMs, FLASH RAMs, and Register RAMs), a BIST controller coupled to the one or more memories to perform write operation and/or to receive the PASS/ FAIL, signal from one or more comparators coupled to the one or more memories. The one or more comparators latch mutually identical outputted data coming from the one or more memories upon a rising edge of an ORDY signal.

Furthermore, the one or more comparators compare the latched mutually identical outputted data and output associated PASS/FAIL signal to the BIST controller. Moreover, the BIST controller m ay register a PASS/FAIL result upon receiving a PASS/FAIL signal from the one or more comparators. The IC may include one or more output registers coupled to the BIST controller and output a data log substantially serially upon receiving a SHIFT CLK signal from the BIST controller. The one or more output registers may also receive the outputted data from the one or more comparators.

Moreover, the IC may include the IC tester coupled to the BIST controller to receive a PASS/FAIL result and/or the BIST diagnostic from the BIST controller. The comparator may include any number of flip-flops to latch the mutually identical outputted data coming from the one or more memories upon the rising edge of the ORDY signal, one or more XOR gates coupled to any number of the flip-flops to receive the latched mutually identical outputted data and perform an XOR logic operation and output XOR results and an OR gate coupled to the one or more XOR gates to receive the XOR results and to perform an OR logic operation on the received XOR results and output the OR results.

In another aspect, a method of testing embedded memories in an IC includes comparing mutually identical memory outputs coming from memory arrays of one or more embedded memories using a comparator that is located external to a BIST controller, outputting a PASS/FAIL signal by the comparator based on the outcome of the comparison, and registering the PASS/FAIL signal in the BIST controller. The method may also include generating a PASS/FAIL result based on the received PASS/FAIL signal from the comparator and outputting the PASS/FAIL result to an IC tester.

The method may further include generating diagnostic data in a debug mode by the BIST controller upon receiving the FAIL signal from the comparator and outputting the diagnostic data to the IC tester for failure analysis. Moreover, the method may include receiving a PASS signal from the comparator and testing the one or more embedded memories without any interruption until the FAIL signal is received from the comparator.

The methods, systems, and apparatuses disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

A method, apparatus and system of a self-test output for high density BIST are disclosed. In the following description, for purposes of explanation, numerous specific details are set forth in order to provide a thorough understanding of the various embodiments. It will be evident, however, to one skilled in the art that the various embodiments may be practiced without these specific details.

In one embodiment, an integrated circuit (IC) includes one or more memories, a BIST controller (e.g., a BIST controller 130 of FIG. 1 that may register a PASS/FAIL result upon receiving the PASS/FAIL signal from the one or more comparators) coupled to the one or more memories to perform write operation and to receive a PASS/FAIL signal from one or more comparators (e.g., a comparator 140 of FIG. 1) latch mutually identical outputted data coming from the one or more memories (e.g., a memory 120 of FIG. 1) upon a rising edge of an output ready (ORDY) signal. Furthermore, the one or more comparators compare the latched mutually identical outputted data and output associated PASS/FAIL signal to the BIST controller.

In another embodiment, a method of testing embedded memories in an IC includes comparing mutually identical memory outputs coming from memory arrays of the one or more embedded memories using a comparator (e.g. the comparator 140 of FIG. 1) that is located external to a BIST controller (e.g., the BIST controller 130 of FIG. 1), outputting a PASS/FAIL signal by the comparator based on an outcome of the comparison and/or registering the PASS/FAIL signal in the BIST controller.

Figure 1:
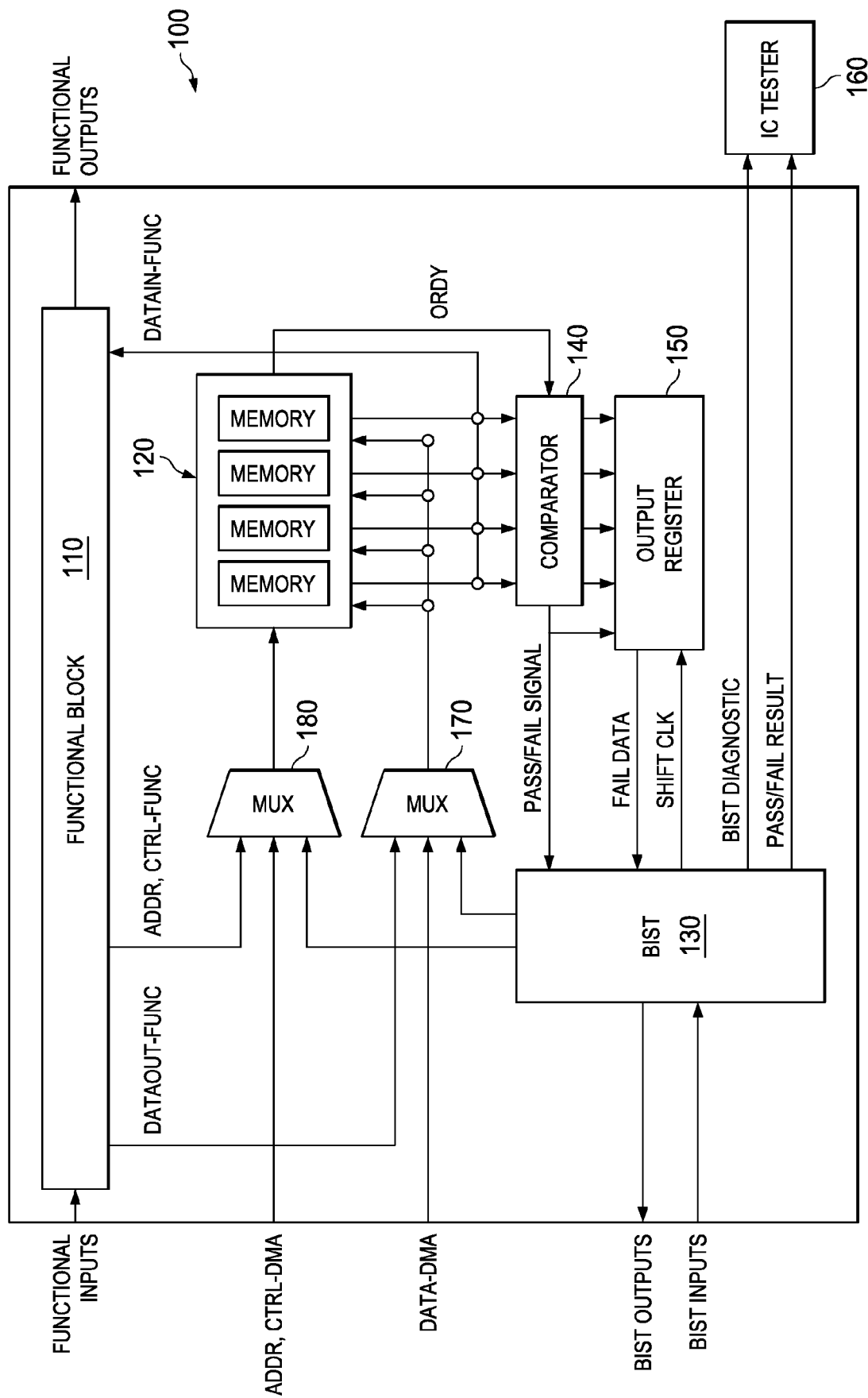
FIG. 1 is a system level block diagram of an IC device using the self-test output compare implementation of a BIST controller, according to one embodiment.

FIG. 1 is a system level block diagram of an IC device using a self-test output compare implementation of a BIST controller 130, according to one embodiment. Particularly, FIG. 1 illustrates a functional block 110, a memory 120, the BIST controller 130, a comparator 140, an output register 150, an IC tester 160, a first multiplexer (MUX) 170 and a second multiplexer 180. The functional block 110 may represent the main functionality of the IC 100. The memory 120 may be an embedded memory, an embedded SRAM (Static random access memory), a DRAM (Dynamic random access memory), a FRAM (Ferroelectric random access memory), a FLASH RAM (Flash random access memory), and a Register RAM (Register random access memory).

The BIST controller 130 may be a built-in-self-test controller commonly used in BIST engine that may provide inputs for write operation to the memory 120. The comparator 140 may compare data from the memory 120. The output register 150 may capture the outputs from the comparator 140 when there is a FAIL condition from the comparison operation. The IC tester 160 may ensure design compliance and/or reduce defects, thereby increasing end product quality. The first multiplexer 170 and the second multiplexer 180 may select one of many data-sources and/or output that data-source into a single channel.

In an example embodiment as illustrated in FIG. 1, the testing of the memory may be divided into two main operations, write operation and read operation. Both operations may source its values either from the functional block 110, the BIST controller 130 and/or ADDR, a CRTRL~DMA and/or a DATA~DMA path based on the selection of the first multiplexer 170 and the second multiplexer 180. The Direct Memory Access path, referred to as a DMA path, may allow direct memory port connectivity to pins of the IC 100 and the IC tester 160.

The write operation may fill memory cells of a memory array with a data type of either one (1s) or zeros (0s) associated with specific address space. An address space may be defined by address input which may consist of row and column address values. It may be noted that an identical data and/or an operation occurs across all the bits of the word. Each bit of the word may belong to its own memory space. For example, in an implementation example of a 4-bit data output, and a 16-bit address space, each output bit belongs to its respective address space.

The signal coming from the respective embedded memory 120 may be an ORDY signal. The ORDY signal may provide the rising edge before the next write and/or read operation. Further, the ORDY signal asserts when the memory outputs are valid, i.e., updated with accessed data. The output register 150 may be a parallel-to-serial shift register which latches these values for data logging option in a debug mode. The PASS/FAIL signal output from the comparator 140 may be connected to the BIST controller 130. The BIST controller 130 may detect a failure when it encounters a high signal.

If set in the debug mode, the BIST controller 130 stops the embedded memories 120 so that it may execute the data logging process. Using a SHIFT CLK signal, the outputs from the output register 150 may be serially scanned into the BIST controller 130. The BIST controller 130 may then concatenate the output data with corresponding input data, address inputs, memory and BIST identification, algorithm type and padding bits. Finally the completed PASS/FAIL information may be substantially serially sent to the IC text 160 may the BIST controller 130 through the BIST DIAGNOSTIC port.

The BIST controller 130 may then resume testing the embedded memories 120 from where it was interrupted last. In the example embodiments, if the testing of the embedded memories 120 is set in a non-debug mode, the test may terminate. The status of the PASS/FAIL signal propagates through the BIST controller 130 as a PASS/FAIL result to the IC tester 160. This mode may also be known as Go-NoGo test mode where the user may be interested to know if the embedded memory 120 under test passes or fails. Typically, diagnostic data may not be required in the Go-NoGo mode.

For example, an IC 100 includes one or more memories 120 (e.g., the one or more memories may include memories selected from a group consisting of the embedded memories 120, embedded SRAMs, DRAMs, FRAMs, FLASH RAMs, and Register RAMs). The IC 100 further includes a BIST controller 130 (e.g., the BIST controller 130 may register the received PASS/FAIL result upon receiving the PASS/FAIL signal from the one or more comparators 140) coupled to the one or more memories to perform write operation and/or to receive the PASS/FAIL signal from each embedded memory 120.

In addition, the IC 100 also includes one or more comparators 140 (e.g., the one or more comparators 140 may latch mutually identical outputted data coming from the one or more memories 120 upon a rising edge of an ORDY signal and/or may compare the latched mutually identical outputted data and outputs associated PASS/FAIL signal to the BIST controller 130) coupled to the one or more memories.

Furthermore, the IC 100 may include one or more output registers 150 coupled to the BIST controller 130 and the one or more comparators 140 that output a data log substantially serially upon receiving a SHIFT CLK signal from the BIST controller 130. Also, the one or more output registers coupled to the one or more comparators, the BIST controller 130, and the IC tester 160 to receive the outputted data from the one or more comparators 140. The IC 100 may further include the IC tester 160 (e.g., the IC tester 160 and/or may receive a PASS/FAIL result and a BIST diagnostic from the BIST controller 130 and outputted data from the output register 150) coupled to the output register 10 and the BIST controller 130.

Moreover, mutually identical memory outputs coming from memory arrays (e.g., the memory 120 of FIG. 1) of the one or more embedded memories may be compared using the comparator 140 that is located external to the BIST controller 130. Also, the PASS/FAIL signal may be outputted by the comparator 140 based on an outcome of the comparison. The PASS/FAIL signal in the BIST controller 130 may also be registered. The PASS/FAIL result may be generated based on the received PASS/FAIL signal from the comparator 140. Moreover, the PASS/FAIL result to the IC tester 160 may be outputted. The diagnostic data in the debug mode may be generated by the BIST controller 130 upon receiving the fail signal from the comparator 140. Also, the diagnostic data may be outputted to the IC tester 160 for failure analysis.

The diagnostic data in the debug mode may be generated upon receiving the FAIL signal from the comparator 140. In addition, the embedded memory 120 may be tested without any interruption until the FAIL signal is received from the comparator 140. The generation of the diagnostic data may be stopped in the debug mode upon receiving the PASS signal from the comparator 140. Furthermore, the PASS/FAIL result may be generated based on the received PASS/FAIL signal from the comparator 140.

Figure 2:
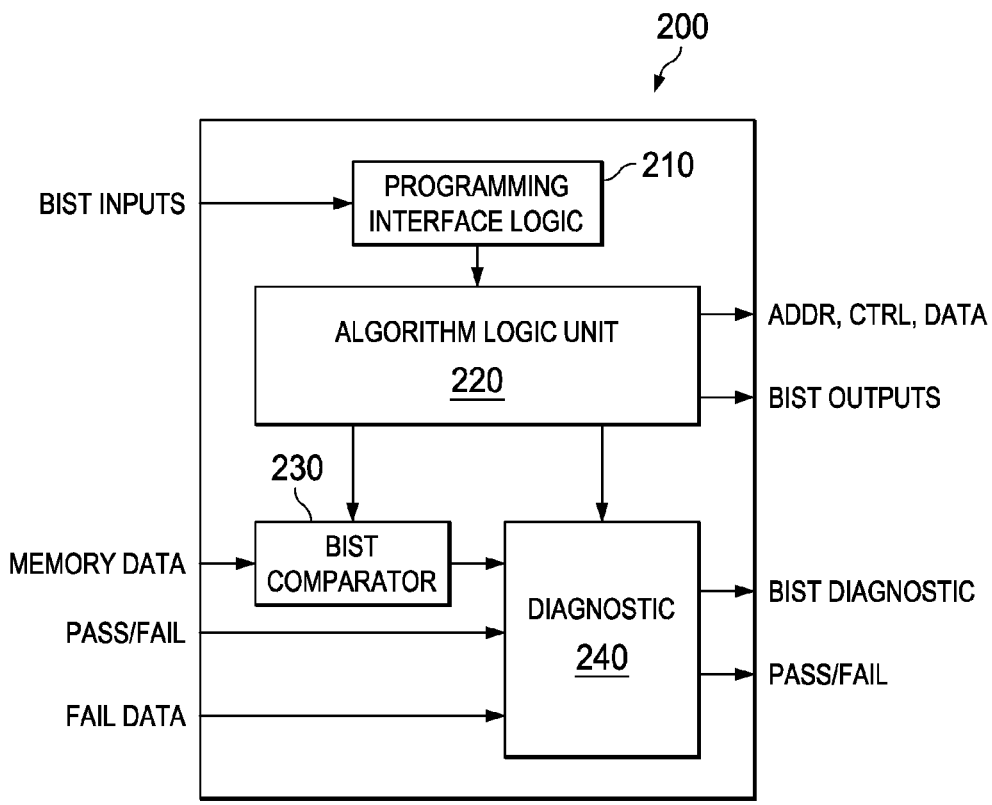
FIG. 2 is an example block diagram of a BIST controller functionality using a BIST comparator, according to one embodiment.

FIG. 2 is an example block diagram of a BIST controller 200 functionality using a BIST comparator 230, according to one embodiment. Particularly, FIG. 2 illustrates a programming interface logic 210, an algorithm logic unit 220, the BIST comparator 230, a diagnostic unit 240, according to one embodiment.

The Programming Interface Logic (PLU) 210 may be the interface where the user defines the BIST modes and/or inputs the algorithm codes. The BIST inputs may be provided to the programming interface logic 210. The Algorithm Logic Unit (ALU) 220 may perform arithmetic operations (e.g., addition, subtraction, multiplication and/or division) and logical operations (e.g. AND, OR, exclusive OR etc) to support the instruction set for memory testing. The output from the algorithm logic unit may be ADDR, CTRL and DATA.

The BIST controller 200 may be equipped with the BIST comparator 230 to compare the data outputted by a memory under test with expected data. The expected data may be provided by the algorithm logic unit 220 to the BIST comparator 230. Data from each memory (e.g., the memory 120 of FIG. 1) under test may be routed to the BIST comparator 230. The diagnostic 240 may perform pre-data logging functions before the BIST (e.g., the BIST controller 130 of FIG. 1) executes the data logging. This may include the concatenation of failed output data with corresponding input test parameter values such as address, data in, algorithm identification, etc. in debug mode. The diagnostic unit 240 may source its values from the BIST comparator 230, the algorithm logic unit 220 and the PASS/FAIL signal. The PASS/FAIL signal from the comparator may be provided to the diagnostic unit 240 after comparison. The diagnostic unit 240 may generate a PASS/FAIL result based on the received signal from the BIST comparator 230.

In one example embodiment, the BIST controller 200 may consists of programming interface logic 210 provided with BIST inputs that may be coupled to the algorithm logic unit 220, BIST comparator 230 provided with memory input and diagnostic data where the diagnostic unit 240 may be provided with PASS/FAIL signal and FAIL data to output BIST diagnostic and/or PASS/FAIL signal.

Figure 3:
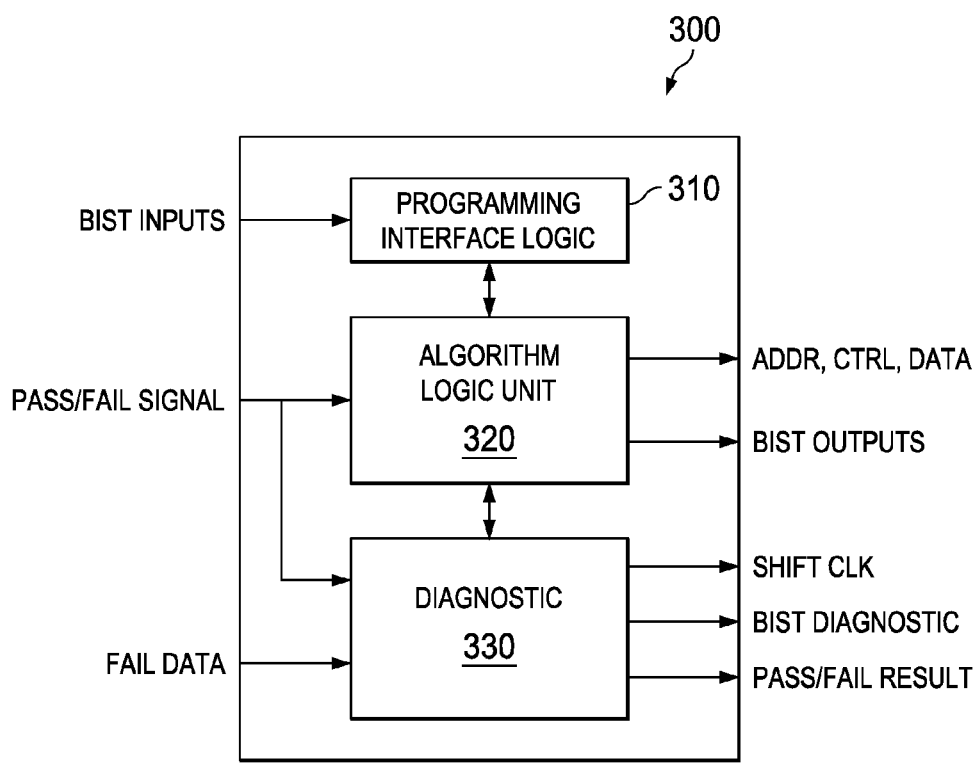
FIG. 3 is an example block diagram of the BIST controller functionality without the comparator function block, according to one embodiment.

FIG. 3 is an example block diagram of a BIST controller 300 functionality without the comparator function block, according to one embodiment. Particularly FIG. 3 illustrates a programming interface logic 310, an algorithm logic unit 320, a diagnostic unit 330, according to one embodiment.

The Programming Interface Logic (PLU) 310 may be the interface where the user defines the BIST modes and/or inputs the algorithm codes. The BIST inputs may be provided to the programming interface logic 310. The Algorithm Logic Unit (ALU) 320 may perform arithmetic operations (e.g., addition, subtraction, multiplication and/or division) and logical operations (e.g., AND, OR, exclusive OR etc) to support the instruction set for memory testing. The diagnostic 330 may perform the pre-data logging functions before the BIST (e.g., the BIST controller 130 of FIG. 1) executes the data logging. This may include the concatenation of failed output data with corresponding input test parameter values such as address, data in, algorithm identification, etc., in the debug mode.

The diagnostic unit 330 may source its values either the algorithm logic unit 320, the PASS/FAIL signal and/or FAIL data. The PASS/FAIL signal from the comparator (e.g., the BIST comparator 230 of FIG. 2) may be provided to the diagnostic unit 330 after comparison. The diagnostic unit 330 may generate a PASS/FAIL result based on the received PASS/FAIL signal from the comparator (e.g., the BIST comparator 230 of FIG. 2).

In example embodiment illustrated in FIG. 3, the BIST controller 300 may consists of programming interface logic 310 provided with BIST inputs that may be coupled to the algorithm logic unit 320 and diagnostic unit 330 where the diagnostic unit 330 may be provided with the PASS/FAIL signal and FAIL data to output BIST diagnostic, SHIFT CLK and PASS/FAIL result.

For example, the PASS/FAIL result may be generated based on the received PASS/FAIL signal from the comparator 140. Furthermore, the PASS/FAIL result to the IC tester (e.g., the IC tester 160 of FIG. 1) may be outputted. The diagnostic data in the debug mode may be generated by the BIST controller (e.g., the BIST controller 130 of FIG. 1) upon receiving the FAIL signal from the component 140.

The diagnostic data in the debug mode may not b e generated upon receiving the PASS signal from the comparator 140. Furthermore, inputting of the diagnostic data to the IC tester may be stopped. In addition, the one or more embedded memories (e.g., the memory 120 of FIG. 1) may be tested without any interruption until the FAIL signal is received from the comparator 140.

Figure 4:
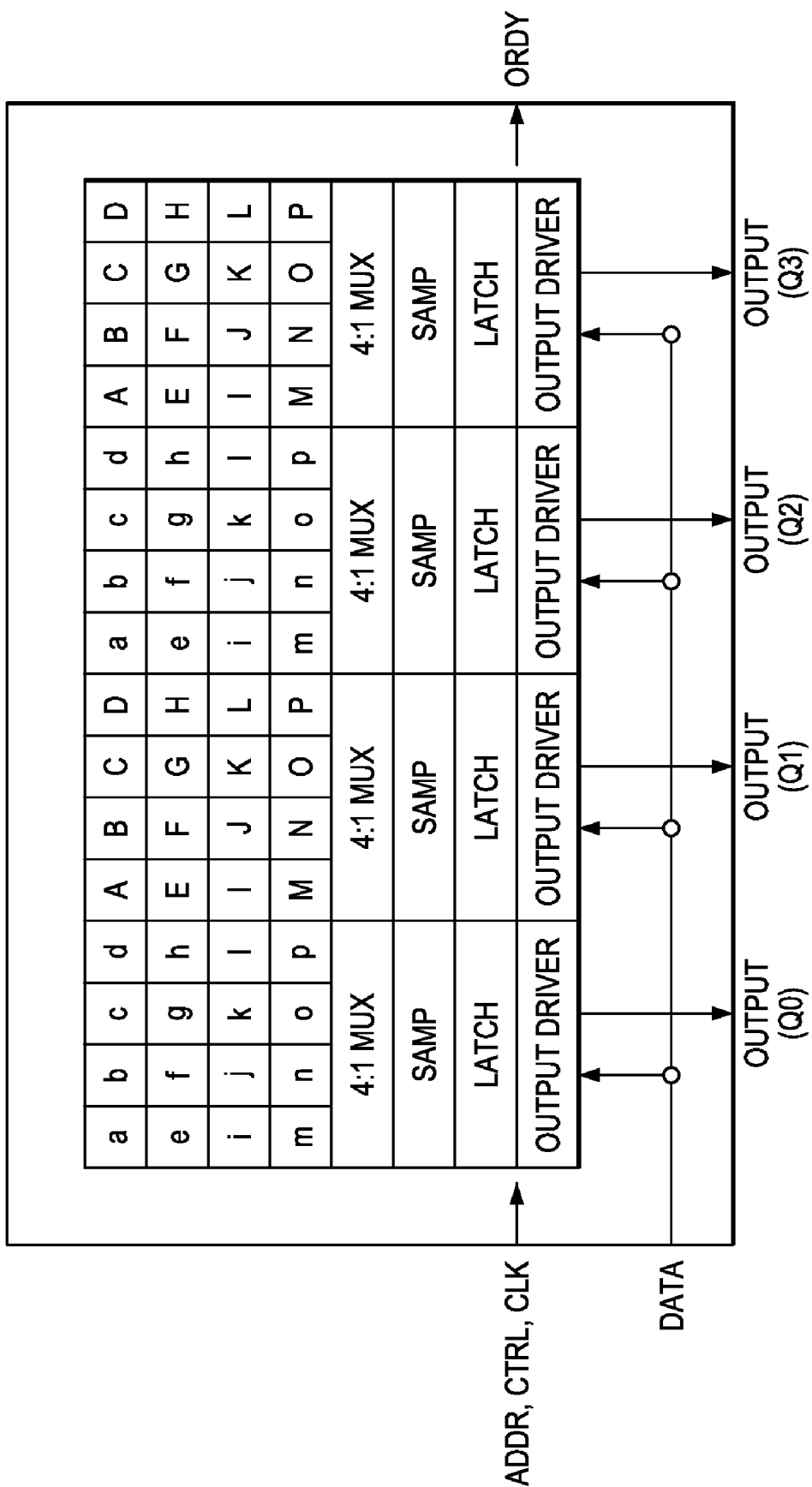
FIG. 4 is an example block diagram depicting a SRAM (static random access memory) device, according to one embodiment.

FIG. 4 is an example block diagram depicting a SRAM (static random access memory) device 400, according to one embodiment. Particularly, FIG. 4 illustrates a memory array of 4 rows, 4 columns, and 4-bit wide word having a maximum of 16 unique address spaces, according to one embodiment.

FIG. 4 illustrates the SRAM memory of 4-bit word width and a 4×4 address space. The alphabet in the array may indicate same physical location addressed across the 4 arrays for a given address. Some data may be written in 'a' and 'A', 'b' and 'B', etc. To test the memory (e.g., with word pattern 1010 or 0101), alternate bits may be paired for the self-test. This may provide test coverage for coupling effects between adjacent word bits. Other word pattern test may need to depend on specific memory data bus layout. The multiplexer (e.g., indicated as 4:1 MUX in FIG. 5) may consists of one or more levels of multiplexers.

In the example embodiment illustrated in FIG. 4, the multiplexer may be controlled by column address inputs. The multiplexer(s) may determine which column from the array may be selected during write and/or read operation. The sense amp circuit (SAMP) block may be used during read operation. The data from the selected column goes to the SAMP that may detect the voltage levels on the data lines (bit lines). Based on the voltage levels, the sense amp may determine whether the column data is data "1" or "0". The latch may capture the data from the SAMP. Finally, an Output Driver circuit may buffer and/or pass the output data to the output port. The same operation may occur simultaneously across all 4 bit words Q0, Q1, Q2 and Q3 independently.

Figure 5:
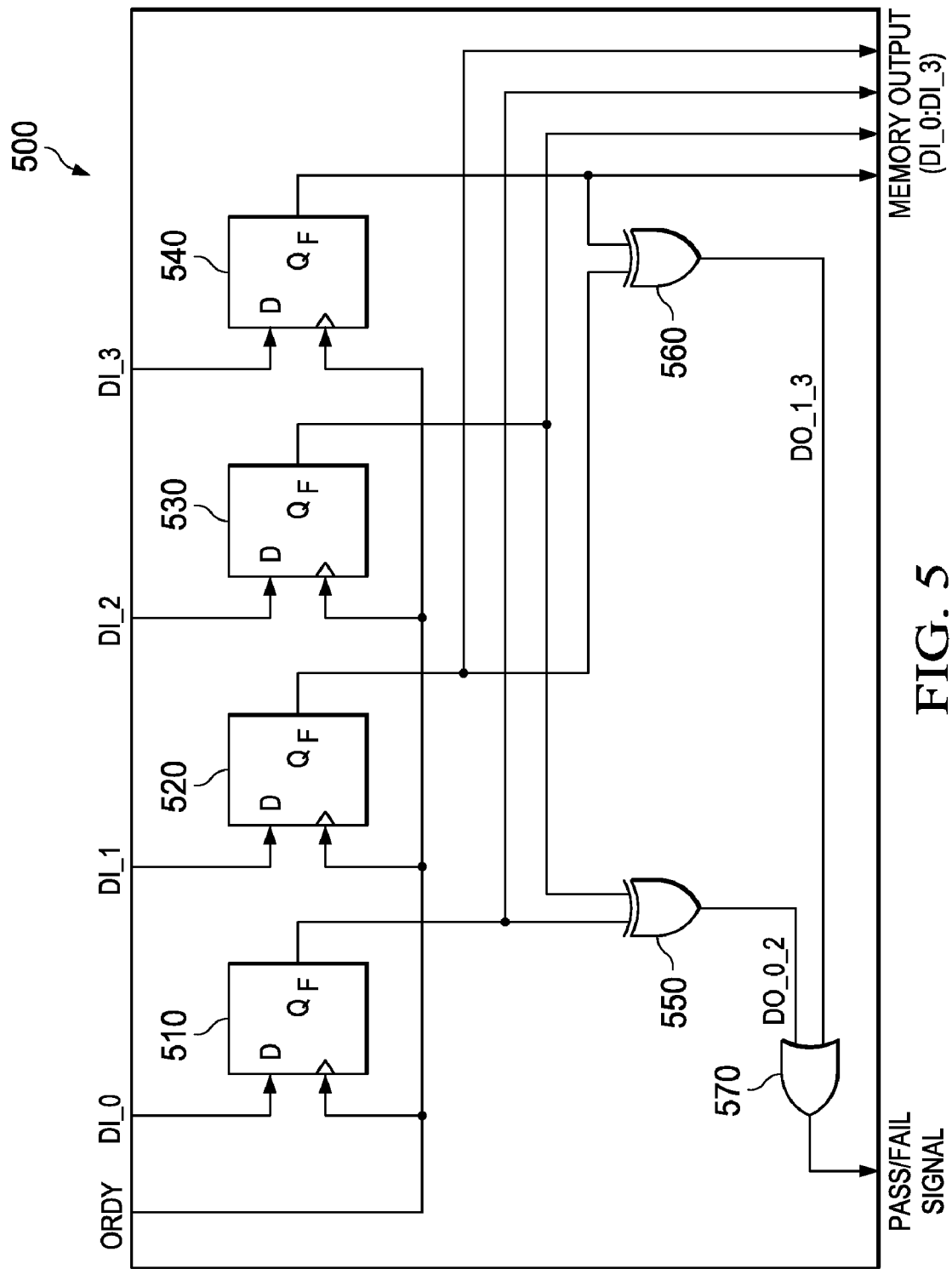
FIG. 5 is an exemplary schematic diagram of a self-test output comparator.

FIG. 5 is an exemplary schematic diagram of a self-test output comparator 500. Particularly, FIG. illustrates, a flip-flop 510, a flip-flop 520, a flip-flop 5350, a flip-flop 540, a XOR 550, a XOR 560, an OR gate 570, according to one embodiment.

The flip-flops 510, 520, 530 and 540 may be received inputs and clock signal (e.g. the ORDY signal). The XOR gate 550, 560 may be a digital logic gate that behaves accordingly to a truth table to perform the received XOR logic operation and thus outputs XOR results. An output may be high or "1" if and only if any one of the inputs of the gate is opposite of the other input. If both inputs are low or "0" or both are high or "1", the output may result in low or "0". The OR gate 570 may be a digital logic gate that behaves according to the truth table that may perform the OR logic operation on the received XOR results and may output OR results. An output of the OR gate may be high or "1", if one or both the inputs to the gate are high or "1". If neither input of the OR gate is high, a low or "0" may result. In the example embodiment illustrated in FIG. 5, the DI_0:DI_3 memory output may be latched into the flip-flops 510, 520, 530 and 540 at the rising edge of the ORDY signal.

The flip-flop 510 and the flip-flop 530 may have inputs DI_0 and DI_2 respectively along with a common ORDY signal as a second input. The flip-flop 520 and the flip-flop 540 may have inputs DI_1 and DI_3 respectively along with the common ORDY signal as a second input. The output of the flip-flops 510 and 530 may be the input to the XOR gate 550. The output of the flip-flops 520 and 540 may be the input to the XOR gate 560. The output from the first and the second XOR gate is the input to the OR gate 570, which outputs the PASS/FAIL signal. The DI_0:DI_3 memory output may be the common output received from the flip-flops 510, 520, 530 and 540.

Figures 6, 8:
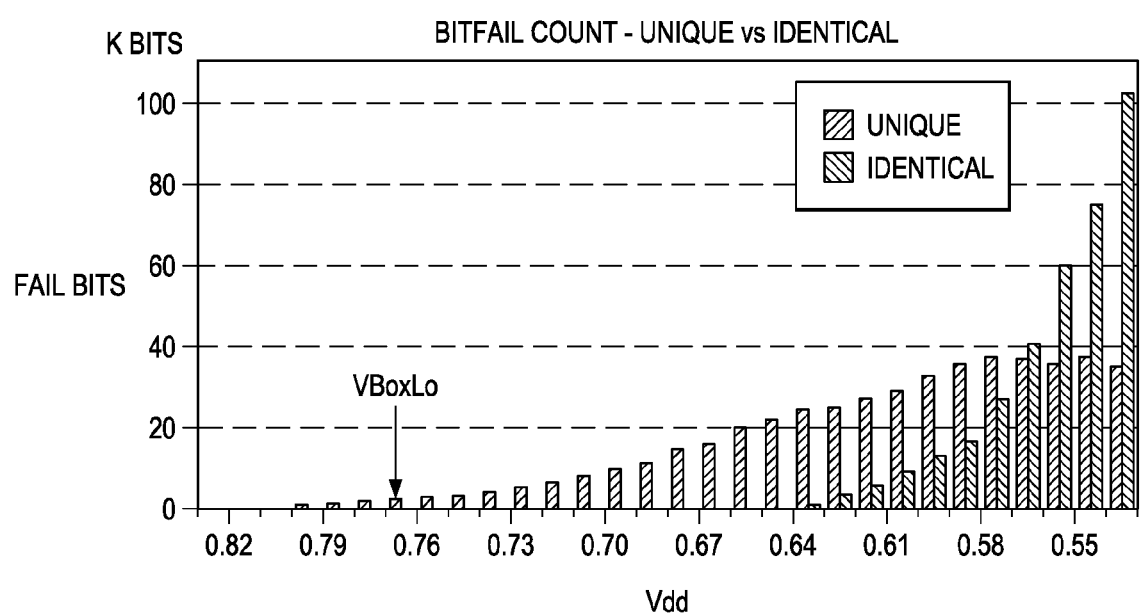
FIG. 6 is a truth table representation of the self-test output comparator of FIG. 5, according to one embodiment of the present subject matter.
FIG. 8 is an exemplary plot diagram of the progression of fail bit count versus memory voltage of the SRAM under test.

FIG. 6 is a truth table representation of the self-test output comparator of FIG. 6, according to one embodiment. Particularly, FIG. 6 illustrates the truth table showing the inputs versus outputs of the XOR function, according to embodiment. The XOR gate may perform the exclusive OR function. The exclusive OR generally symbolized by XOR or EOR may perform logical operation on two operands that may result in a logical value of true if and only if one of the operands has a value of true. DI_X and DI_Y are inputs to a XOR gate (e.g., the XOR gate 550, 560 of FIG. 5) whose outputs are $DO\_X\_Y$.

If both the operands (e.g., DI_X and DI_Y) are low or "0" the output of the XOR function is low or "0". The comparator may generate a pass signal to the BIST controller 130. If any one of the operand is high (e.g., DI_X=1 and DI_Y=0 or $DI_X=0$ and DI_Y=1) then the output of the XOR function is high or "1" and then, the comparator may generate a fail signal to the BIST controller 130. If both the operands are high (e.g., DI_X=1 and DI_Y=1) then the output of the XOR function is low or "0". Therefore the comparator may generate the pass signal to the BIST controller 130. During test if there is no fails, or there is a pass, the outputs would remain a low or "0". If any one of the output fails, the corresponding XOR output may be a high or "1".

Figure 7:
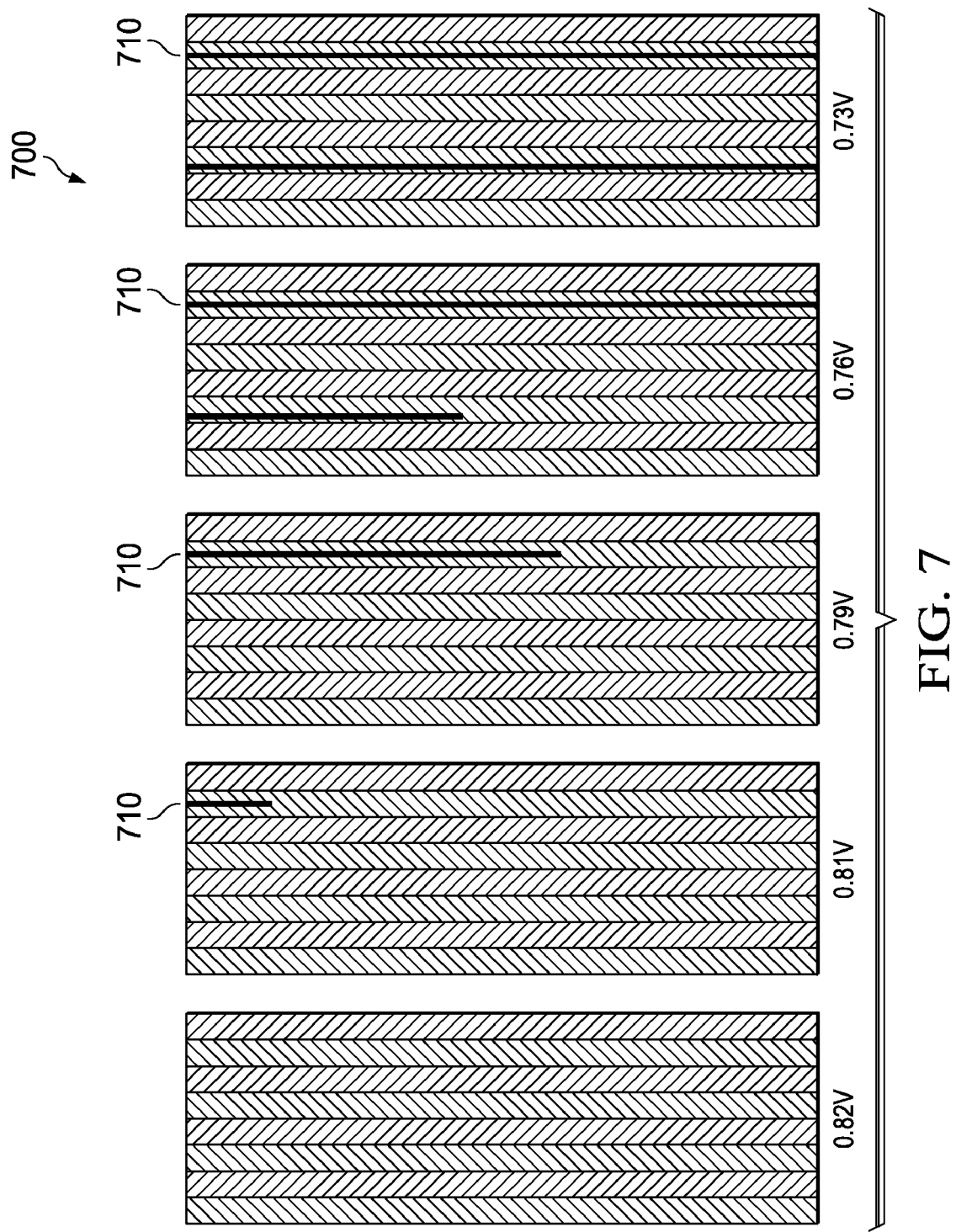
FIG. 7 is an exemplary bitmap representation of the SRAM device under test showing the passing to failing region by varying the voltage.

FIG. 7 is an exemplary bitmap representation of the SRAM device under test showing the passing to failing region by varying the voltage, according to one embodiment. Particularly, FIG. 7 illustrates a typical bitmap of the SRAM tested over a voltage range, going from passing to failing voltages. The data may depict that the first fail may occur at a given voltage as the voltage is progressively lowered. During this progression, the fails may be detectable by the comparator (e.g., the comparator 140 of FIG. 1). As illustrated in FIG. 7, the first fail begins to appear at 0.81 V as multi bit cells in column direction. As the test voltage is lowered further, more columns begin to appear and thicken with increasing fails.

FIG. 8 is an exemplary plot diagram of the progression of fail bit count versus memory voltage on the SRAM under test 800. Particularly, FIG. 8 illustrates a plot 800 of the fail bit cell count on the Y-axis versus test voltage on the X-axis, according to one embodiment.

There may be two categories of the fail count. The first category may be when the fails may come from unique addresses and/or same addresses and not from the paired memory outputs. These may be designated as 'unique'. The second category may fail with identical addresses and from same paired memory outputs. These may be designated as 'identical'. The second category fails may indicate ineffective test screen by the self-test output comparator (e.g. the comparator 140 of FIG. 1). When two fails occur and appear at the inputs of the same XOR gate (e.g., the XOR gate of FIG. 4), the output may remain low or "0". The plot may show that unique fails appear at earliest test voltage and may continue to exist at lowest test voltage.

The identical category fails may appear at about 200 mv after the first unique fails. From this data the probability of test escapes due to this aliasing may not be significant. This may be described in the context of using a BIST methodology the self-test output compare technology may not be restricted by the usage of the above BIST controller (e.g. the BIST controller 130 of FIG. 1). Off-chip direct memory access mode (DMA) may be used to perform the write operation.

Multiplexers (e.g., multiplexers 170, 180 of FIG. 1) may select the DMA inputs directly from the IC pins. Other alternatives may include CPU-BIST or other on-chip ALU (e.g. the algorithm logic unit 220 of FIG. 2) to perform the write operation only. The requirement of the on-chip ALU may be to provide address, data, control, and clock signal inputs to the memory. The write operation may fill the address space (e.g. bit cells) with same data across each sub-array or alternate sub-arrays.

Figure 9:
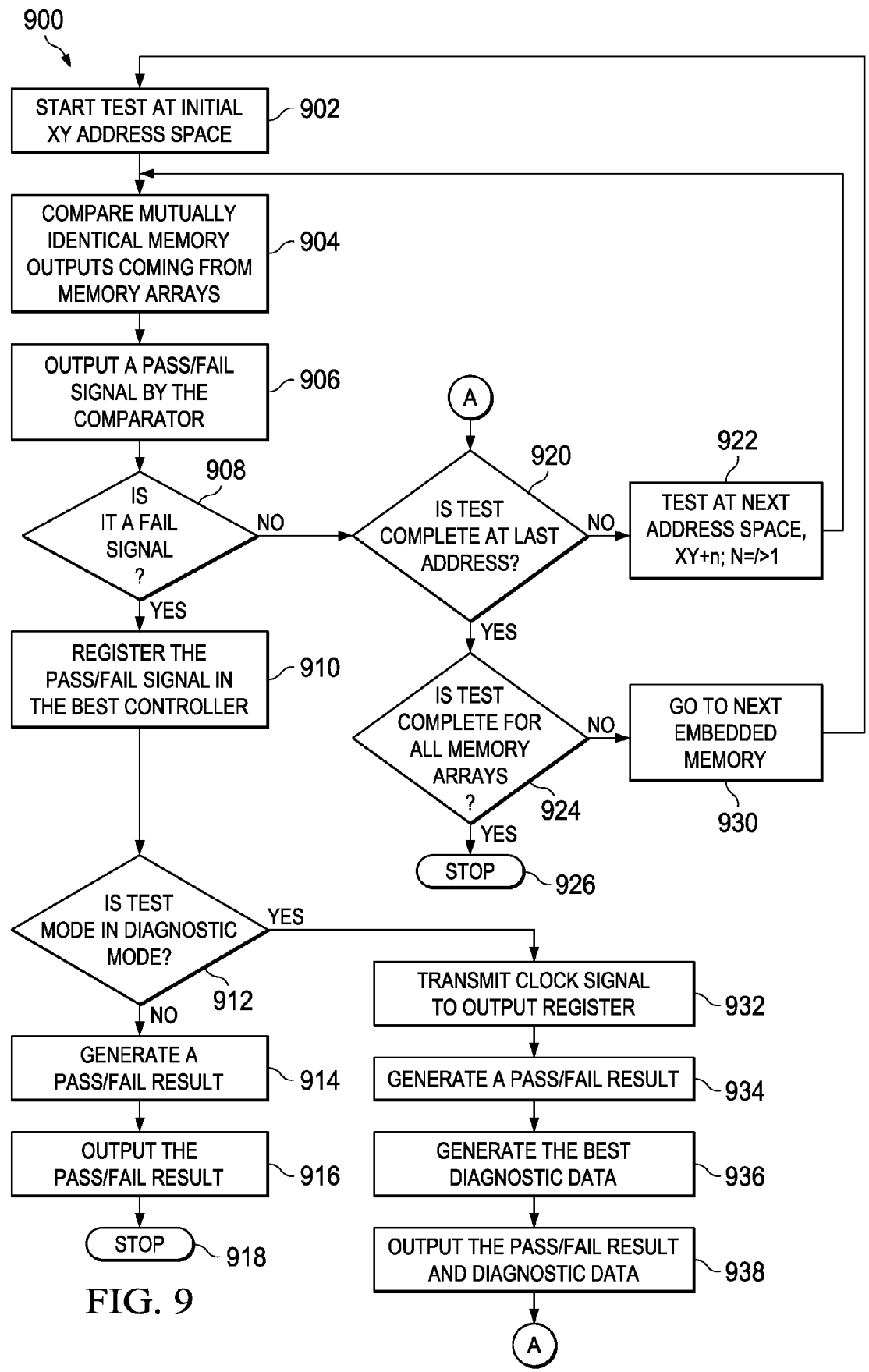
FIG. 9 is a process flow of testing embedded memories in an integrated circuit, according to one embodiment of the present subject matter.

FIG. 9 is a process flow of testing embedded memories in an IC 100, according to one embodiment. In operation the method 900 starts at 902 by initially starting the test at XY address space in an embedded memory. At 904, mutually identical outputs coming from memory arrays (e.g., the memory 120 of FIG. 1) of one or more embedded memories may be compared using a comparator (e.g., the comparator 140 of FIG. 1) that is located external to a BIST controller (e.g., the BIST controller 130 of FIG. 1). In operation 906, a PASS/FAIL signal may be outputted by the comparator based on the outcome of the comparison. At 908, the method 900 determined whether the outputted PASS/FAIL signal is a FAIL signal. In operation 910, the outputted PASS/FAIL signal is registered in the BIST controller if the outputted signal is a FAIL signal based on the determination at 908.

At 912, the method 900 determines whether the test mode is in diagnostic mode. At 914, a PASS/FAIL result is generated if the test mode is not in diagnostic mode based on the determination at 912. At 916, the PASS/FAIL result is outputted. At 918, the method 900 stops further testing of the embedded memories.

The method 900 goes to step 920 if the outputted PASS/FAIL signal at 906 is a PASS signal. Also in these embodiments, one or more embedded memories (e.g., the memory 120 of FIG. 1) may be tested without any interruption until the FAIL signal is received from the comparator.

At 920, the method 900 determines whether the test completed is at last address. At 922, next address space XY+n; N=/>1 is tested by repeating steps 904-922 if there is no FAIL signal from the comparator, and the test completed is not at the last address based on the determination at 920. Steps 904-938 are repeated if there is a FAIL signal from the comparator while in diagnostic mode, and the test completed is not at the last address based on the determination at 920. The method 900 goes through steps 904-918 if there is a FAIL signal and not in the diagnostic mode. The method 900 goes to step 924 if the test completed is at the last address based on the determination at 920. At 924 the method 900 determines whether the test is completed for all embedded memories. At 926, the method 900 goes to step 926 and stops further testing of the embedded memories if all the testing of all embedded memories is completed based on the determination at 924. At 930, the method goes to next embedded memory and continues at step 902 if the testing of all the embedded memories is not completed based on the determination at 924.

At 932, a clock signal is transmitted to output register if the test mode is in diagnostic mode based on the determination at 912. At 934 a PASS/FAIL result is generated. At 936 a BIST DIAGNOSTIC DATA is generated. At 938, the generated PASS/FAIL result and BIST DIAGNOSTIC DATA are outputted.

Although the present embodiment have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or may combination of hardware, firmware, and/or software (e.g., embodied in a machine readable medium). For example, the various electrical structure and methods may be embodied using transistors, logic gates, and electrical circuits (e.g., application specific integrated ASIC circuitry).

In addition, it will be appreciated that the various operations, processes, and methods disclosed herein may be embodied in a machine-readable medium and/or a machine accessible medium compatible with a data processing system (e.g., a computer system), and may be performed in any order. Accordingly, the specification and drawings are to be regarded in an illustrative rather than a restrictive sense.

What is claimed is:

1. An integrated circuit (IC), comprising:
    one or more memories;
    a built-in self test (BIST) controller coupled to the one or more memories to perform write operation; and
    one or more comparators coupled to the one or more memories, wherein the one or more comparators latch identically addressable outputted data coming from the one or more memories upon a rising edge of an output ready (ORDY) signal, and wherein the one or more comparators compare the latched identically addressable outputted data and output associated PASS/FALL signal to the BIST controller, and wherein the BIST controller registers a PASS/FALL result upon receiving the PASS/FAIL signal from the one or more comparators.

2. The IC of claim 1, further comprising one or more output registers coupled to the BIST controller that output a data log substantially serially upon receiving a SHIFT CLK signal from the BIST controller.

3. The IC of claim 2, wherein the one or more output registers coupled to the one or more comparators, the BIST controller, and an IC tester, wherein the one or more output registers receive the outputted data from the one or more comparators, and wherein the IC tester receives the PASS/FAIL result and BIST diagnostic from the BIST controller.

4. The IC of claim 3, further comprising the IC tester coupled to the BIST controller, wherein the IC tester receives PASS/FAIL result and the BIST diagnostic from the BIST controller.

5. The IC of claim 1, wherein the comparator comprises:
    a plurality of flip-flops to latch the identically addressable outputted data coming from the one or more memories upon the rising edge of the ORDY signal;
    one or more XOR gates coupled to the plurality of flip-flops receive the latched identically addressable outputted data and perform an XOR logic operation and output XOR results; and
    an OR gate coupled to the one or more XOR gates to receive the XOR results and perform an OR logic operation on the received XOR results and output OR results.

6. The IC of claim 1, wherein the one or more memories comprise memories selected from the group consisting of embedded memories, embedded SRAMs, DRAMs, FRAMs, FLASH RAMs, and Register RAMs.

7. A method of resting embedded memories in an IC, comprising:
    comparing identically addressable memory outputs coming from memory arrays of the one or more embedded memories using a comparator that is located external to a BIST controller;
    outputting a PASS/FAIL signal by the comparator based on an outcome of the comparison; and
    registering the PASS/FAIL signal in the BIST controller.

8. The method of claim 7, further comprising:
    in non-diagnostic mode generating a PASS/FAIL result based on the received PASS/FAIL signal from the comparator; and
    outputting the PASS/FAIL result to an IC tester.

9. The method of claim 8, further comprising:
    in diagnostic mode generating diagnostic data by the BIST controller upon receiving the FAIL signal from the comparator; and
    outputting both the diagnostic data and PASS/FAIL result to the IC tester for failure analysis.

10. The method of claim 9, further comprising:
    stopping the generation of the diagnostic data in the debug mode upon receiving the PASS signal from the comparator;
    generating the PASS/FAIL result based on the received PASS/FAIL signal from the comparator; and
    testing the one or more embedded memories without any interruption until the FAIL signal is received from the comparator.

* * * * *